(12) United States Patent
Kim et al.

(10) Patent No.: US 11,476,820 B2
(45) Date of Patent: Oct. 18, 2022

(54) INDUCTOR DEVICE, FILTER DEVICE, AND STEERING SYSTEM

(71) Applicant: MANDO CORPORATION, Pyeongtaek-si (KR)

(72) Inventors: Nam Gyun Kim, Gwangju-si (KR); Doo Jin Lee, Osan-si (KR)

(73) Assignee: MANDO CORPORATION, Pyeongtaek-si (KR)

( * ) Notice: Subject to any disclaimer, the term of this patent is extended or adjusted under 35 U.S.C. 154(b) by 629 days.

(21) Appl. No.: 16/548,001

(22) Filed: Aug. 22, 2019

(65) Prior Publication Data
US 2020/0067478 A1 Feb. 27, 2020

(30) Foreign Application Priority Data
Aug. 27, 2018 (KR) .......................... 10-2018-0100162

(51) Int. Cl.
| | |
|---|---|
| *H03H 7/01* | (2006.01) |
| *H03H 7/09* | (2006.01) |
| *B62D 5/04* | (2006.01) |
| *H01F 27/28* | (2006.01) |
| *H01F 27/24* | (2006.01) |
| *H02P 27/06* | (2006.01) |
| *H02P 23/14* | (2006.01) |
| *H01F 27/40* | (2006.01) |
| *H03H 7/42* | (2006.01) |
| *H01F 17/06* | (2006.01) |

(52) U.S. Cl.
CPC ......... *H03H 7/0115* (2013.01); *B62D 5/0457* (2013.01); *H01F 17/062* (2013.01); *H01F 27/24* (2013.01); *H01F 27/2823* (2013.01); *H01F 27/40* (2013.01); *H02P 23/14* (2013.01); *H02P 27/06* (2013.01); *H03H 7/427* (2013.01)

(58) Field of Classification Search
CPC .. H03H 2001/0085; H03H 7/427; H03H 7/09; H03H 7/0115; H01F 17/062; B65D 5/0457
USPC .................................................. 333/181, 185
See application file for complete search history.

(56) References Cited

U.S. PATENT DOCUMENTS

| | | | | |
|---|---|---|---|---|
| 5,195,232 | A * | 3/1993 | Frederick | H05K 9/0066 29/855 |
| 5,838,215 | A * | 11/1998 | Gu | H01F 1/344 252/62.56 |
| 2014/0300304 | A1* | 10/2014 | Omae | H02M 1/44 318/400.24 |

* cited by examiner

*Primary Examiner* — Rakesh B Patel
(74) *Attorney, Agent, or Firm* — Hauptman Ham, LLP

(57) ABSTRACT

An inductor device, a filter device, and a steering system. The inductor device includes first to third cores and first and second wires. The first core, a portion of the first wire passing through the first core, and a portion of the second wire passing through the first core are provided as a first inductor. The second core and another portion of the first wire passing through the second core are provided as a second inductor. The third core and another portion of the second wire passing through the third core are provided as a third inductor.

9 Claims, 13 Drawing Sheets

INDUCTOR DEVICE, FILTER DEVICE, AND STEERING SYSTEM

CROSS REFERENCE TO RELATED APPLICATION

This application claims priority from Korean Patent Application No. 10-2018-0100162, filed on Aug. 27, 2018, which is hereby incorporated by reference for all purposes as if fully set forth herein.

BACKGROUND

Field

Embodiments relate to an inductor device, a filter device, and a steering system.

Description of Related Art

In general, a power supply refers to a device supplying power necessary for a load. Recently, a power supply has included power electronics able to control and convert power using switching characteristics of switching elements in order to supply power necessary for a load.

However, such power electronics may experience noise due to switching of switching elements, which is problematic. Recently, research to remove such noise in power supplies for vehicles has been actively undertaken.

BRIEF SUMMARY

Various aspects provide an inductor device, a filter device, and a steering system able to effectively remove noise.

According to an aspect, embodiments provide an inductor device including: first to third cores and first and second wires, wherein the first core, a portion of the first wire passing through the first core, and a portion of the second wire passing through the first core are provided as a first inductor, the second core and another portion of the first wire passing through the second core are provided as a second inductor, and the third core and another portion of the second wire passing through the third core are provided as a third inductor.

According to another aspect, embodiments provide a filter device including: an inductor including first to third cores and first and second wires, wherein the first core, a portion of the first wire passing through the first core, and a portion of the second wire passing through the first core are provided as a first inductor, the second core and another portion of the first wire passing through the second core are provided as a second inductor, and the third core and another portion of the second wire passing through the third core are provided as a third inductor; and a capacitor including at least one capacitor connected to the first wire and the second wire in parallel.

According to another aspect, embodiments provide a steering system including: a power supply module supplying power; a filter filtering an output of the power supply module; and a steering control module including a steering motor power supply generating assistant steering force by converting the output of the power supply module, filtered in response to a steering motor control signal, and controlling a steering motor using the assistant steering force. The filter may include: an inductor including first to third cores and first and second wires, wherein the first core, a portion of the first wire passing through the first core, and a portion of the second wire passing through the first core are provided as a first inductor, the second core and another portion of the first wire passing through the second core are provided as a second inductor, and the third core and another portion of the second wire passing through the third core are provided as a third inductor; and a capacitor including at least one capacitor connected to the first wire and the second wire in parallel.

According to exemplary embodiments, the inductor device, the filter device, and the steering system can effectively remove common mode (CM) noise and differential mode (DM) noise, increase a space, in which a printed circuit board (PCB) and an electronic control unit (ECU) are used, due to a reduced package, and reduce costs due to the reduced package.

DESCRIPTION OF DRAWINGS

The above and other objects, features, and advantages of the present disclosure will be more clearly understood from the following detailed description, taken in conjunction with the accompanying drawings, in which.

DETAILED DESCRIPTION

Figure 1:
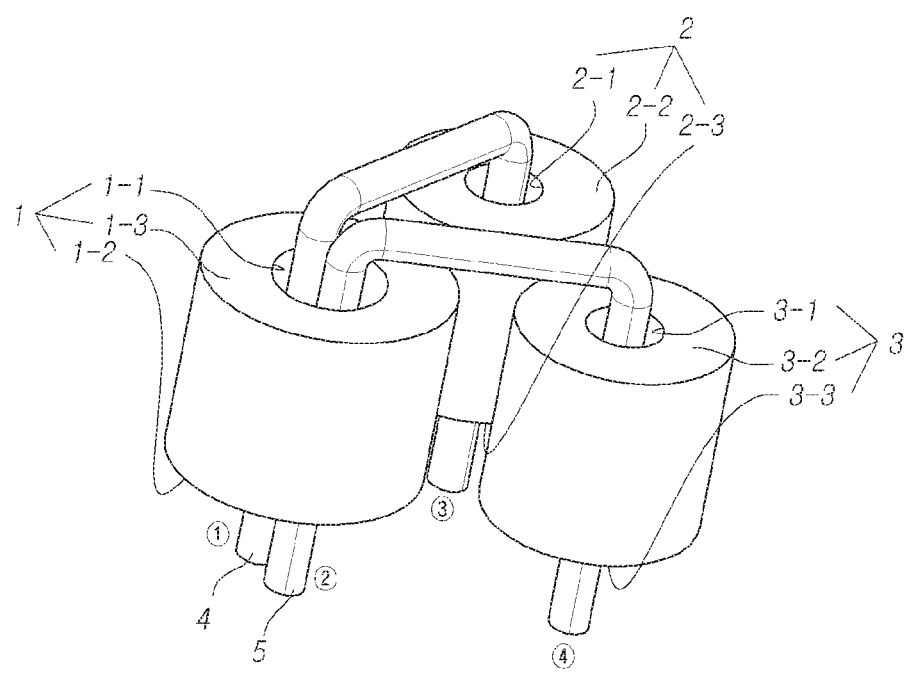
FIG. 1 is a perspective view illustrating an inductor device according to embodiments.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including", "having", "containing", "constituting", "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after", "subsequent to", "next", "before", and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Herein, it will be apparent to those skilled in the art, to which embodiments of the present disclosure pertain, that the term "inductor" may be substituted with another term having an equivalent meaning, such as coil, induction reactor, or choke, and that the term "capacitor" may be substituted with another term having an equivalent meaning, such as condenser or capacitance reactor.

Hereinafter, an inductor device, a filter device, and a power supply according to embodiments will be described with reference to the accompanying drawings.

FIG. 1 is a perspective view illustrating an inductor device according to embodiments.

Referring to FIG. 1, the inductor device according to embodiments may include cores 1, 2, and 3, wires 4 and 5, and the like.

Each of the cores 1, 2, and 3 may provide a body. That is, the cores 1, 2, and 3 may provide inductor bodies on which the wires 4 and 5 are wound.

Each of the cores 1, 2, and 3 may be made of at least one material selected from among, but not limited to, ceramics, ferrites, powered iron, sendust, molypermalloy, or combinations thereof. The cores 1, 2, and 3 may be made of any material, as long as the cores can provide bodies on which the wires can be wound and/or can generate inductance together with the wires wound thereon.

As illustrated in the drawings, the cores 1, 2, and 3 may have the shape of at least one selected from among, but not limited to, a cylinder, a drum, a barrel, or combinations thereof. The cores 1, 2, and 3 may have any shape, as long as the cores can provide bodies on which the wires can be wound and/or can generate inductance together with the wires wound thereon.

The cores 1, 2, and 3 may have holes 1-1, 2-1, and 3-1. That is, the cores 1, 2, and 3 may have holes 1-1, 2-1, and 3-1, through which the wires 4 and 5 pass. For example, as illustrated in the drawings, the cores 1, 2, and 3 may have the shape of a drum, with a hole, through which wires can pass, being provided in the central portion of each of the drum-shaped cores.

As illustrated in the drawings, the cores 1, 2, and 3 may be comprised of three cores. However, this is not intended to be limiting, and four or more cores may be provided. For example, the three cores 1, 2, and 3 may be combined as a set, and a plurality of sets respectively comprised of three cores may be provided.

The wires 4 and 5 may be wound on the cores 1, 2, and 3. The wires 4 and 5, wound on the cores 1, 2, and 3, may generate an electromagnetic field in response to a current applied thereto. That is, the wires 4 and 5 may generate (or determine) inductance.

The wires 4 and 5 may be referred to as conductive lines. The composition of the wires 4 and 5 may include at least one material of copper (Cu), aluminum (Al), or alloys thereof. However, this is not intended to be limiting, compositions of the wires 4 and 5 may include any material, as long as the material may be wound on a core to generate inductance.

The wires 4 and 5 may have the shape of a coil, but this is not intended to be limiting. The wires 4 and 5 may have nay shape, as long as the wires may be wound on the cores 1, 2, and 3 to generate inductance.

The wires 4 and 5 may pass through the holes 1-1, 2-1, and 3-1 of the cores 1, 2, and 3. For example, the wires 4 and 5 may pass through the holes 1-1, 2-1, and 3-1 provided in the central portions of the drum-shaped cores.

As illustrated in the drawings, the wires 4 and 5 may be provided as two wires. However, this is not intended to be limiting, and three or more wires may be provided. For example, the two wires 4 and 5 may be combined as a pair, and a plurality of pairs respectively comprised of two wires may be provided.

Hereinafter, a situation in which the cores 1, 2, and 3 include first, second, and third cores and the wires 4 and 5 include first and second wires will be described.

The first wire 4 and the second wire 5 may pass through the first core 1.

For example, each of the first wire 4 and the second wire 5 may pass through the hole 1-1 of the drum-shaped first core 1. In particular, the first wire 4 and the second wire 5 may pass through the hole 1-1 of the drum-shaped first core 1 without overlapping each other.

In addition, in the hole 1-1 of the drum-shaped first core 1, the first wire 4 and the second wire 5 may be located to face each other.

In addition, each of the first wire 4 and the second wire 5 may be wound on the drum shaped first core 1 by passing through the hole 1-1 of the drum-shaped first core 1.

The first core 1, a portion of the first wire 4, passing through the first core 1, and a portion of the second wire 5, passing through the first core 1, may be provided as a first inductor L1. Here, the portions of the first wire 4 and the second wire 5, passing through the first core 1, may refer to portions passing through the hole 1-1 of the first core 1, of the entire portions of the first wire 4 and the second wire 5.

For example, the first inductor L1 may be comprised of the drum-shaped first core 1 and the first wire 4 and the second wire 5 passing through the drum-shaped first core 1.

The first inductor L1 may be a common mode (CM) inductor.

For example, the first inductor L1, comprised of the drum-shaped first core 1 and the first wire 4 and the second wire 5 passing through the drum-shaped first core 1, may be a CM inductor. Accordingly, the CM inductor may remove CM noise.

The first wire 4 may pass through the second core 2.

For example, the first wire 4 may pass through the hole 2-1 of the drum-shaped second core 2. In addition, the first wire 4 may be wound on the drum-shaped second core 2 by passing through the hole 2-1 of the drum-shaped second core 2.

The second core 2 and another portion of the first wire 4, passing through the second core 2, may be provided as a second inductor L2. Here, the other portion of the first wire 4 may refer to a portion passing through the hole 2-1 of the second core 2, of the entire portions of the first wire 4.

For example, the second inductor L2 may be comprised of the drum-shaped second core 2 and the first wire 4 passing through the drum-shaped second core 2.

The second inductor L2 may be a differential mode (DM) inductor.

For example, the second inductor L2, comprised of the drum-shaped second core 2 and the first wire 4 passing through the drum-shaped second core 2, may be a first DM inductor. Accordingly, the first DM inductor may remove DM noise.

The second wire 5 may pass through the third core 3.

For example, the second wire 5 may pass through the hole 3-1 of the drum-shaped third core 3. In addition, the second wire 5 may be wound on the drum-shaped third core 3 by passing through the hole 3-1 of the drum-shaped third core 3.

The third core 3 and another portion of the second wire 5, passing through the third core 3, may be provided as a third inductor L3. Here, the other portion of the second wire 5 may refer to a portion passing through the hole 3-1 of the drum-shaped third core 3, of the entire portions of the second wire 5.

For example, the third inductor L3 may be comprised of the drum-shaped third core 3 and the second wire 5 passing through the drum-shaped third core 3.

The third inductor L3 may be a DM inductor.

For example, the third inductor L3, comprised of the drum-shaped third core 3 and the second wire 5 passing through the drum-shaped third core 3, may be a second DM inductor. Accordingly, the second DM inductor may remove DM nose.

As described above, the first wire 4, starting from ①, may pass through the hole 1-1 extending through one end surface 1-2 and the other end surface 1-3 of the first core 1, and then, pass through the hole 2-1 extending through one end surface 2-2 and the other end surface 2-3 of the second core 2, before reaching ③.

In addition, the second wire 5, starting from ②, may pass through the hole 1-1 extending through the one end surface 1-2 and the other end surface 1-3 of the first core 1, and then, pass through the hole 3-1 extending through one end surface 3-2 and the other end surface 3-3 of the third core 3 before reaching ④.

Here, the first core 1 and the first wire 4 and the second wire 5, located in the hole 1-1 extending through the one end surface 1-2 and the other end surface 1-3 of the first core 1, may provide the first inductor L1, i.e. the CM inductor.

In addition, the second core 2 and the first wire 4, located in the hole 2-1 extending through one end surface 2-2 and the other end surface 2-3 of the second core 2, may provide the second inductor L2, i.e. the first DM inductor.

In addition, the third core 3 and the second wire 5 located in the hole 3-1 extending through one end surface 3-2 and the other end surface 3-3 of the third core 3, may provide the third inductor L3, i.e. the second DM inductor.

As described above, the inductor device according to embodiments has an integrated structure of the single CM inductor and the two DM inductors formed from the three cores and the two wires. The inductor device having this structure can effectively remove CM noise and DM noise, increase a space, in which a printed circuit board (PCB) and an electronic control unit (ECU) are used, due to a reduced package, and reduce costs due to the reduced package.

Figure 2:
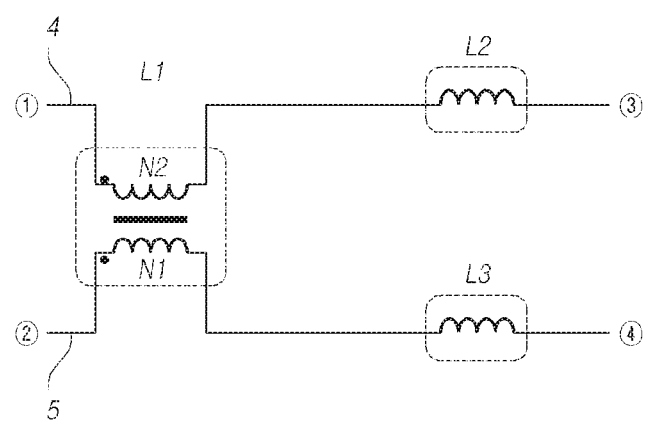
FIG. 2 is a circuit diagram illustrating the inductor device according to embodiments.

FIG. 2 is a circuit diagram illustrating the inductor device according to embodiments.

Referring to FIG. 2, the inductor device according to embodiments may include the first inductor L1, the second inductor L2, the third inductor L3, and the like.

That is, in the first wire 4 starting ① from and reaching ③, a portion of the first wire 4 passing through the first core 1 may provide the first inductor L1 together with the first core 1, while another portion of the first wire 4 passing through the second core 2 may provide the second inductor L2 together with the second core 2.

In addition, in the second wire 5 starting from ② and reaching ④, a portion of the second wire 5 passing through the first core 1 may provide the first inductor L1 together with the first core 1, while another portion of the second wire 5 passing through the third core 3 may provide the third inductor L3 together with the third core 3.

Here, the first inductor L1 may be a CM inductor, the second inductor L2 may be a first DM inductor, and the third inductor L3 may be a second DM inductor.

Figure 3:
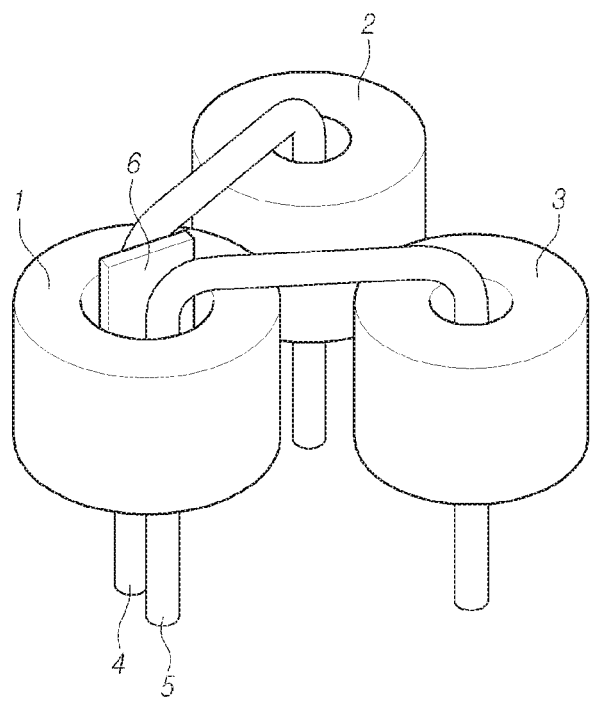
FIG. 3 is a perspective view illustrating a separator of the inductor device according to embodiments.

FIG. 3 is a perspective view illustrating a separator of the inductor device according to embodiments.

Referring to FIG. 3, the inductor device according to embodiments may further include a separator (or diaphragm) 6. That is, the first inductor L1 may further include the separator 6.

The separator 6 may be located in the hole 1-1 of the first core 1. That is, the separator 6 may be located between the portion of the first wire 4, passing through the first core 1, and the portion of the second wire 5, passing through the first core 1, to separate, i.e. insulate, the portion of the first wire 4 and the portion of the second wire 5 from each other. Accordingly, the separator 6 may be an insulator able to insulate the portion of the first wire 4 and the portion of the second wire 5 from each other. As described above, the separator according to embodiments may prevent the first wire and the second wire from being short-circuited, thereby improving the reliability of the inductors.

Figure 4:
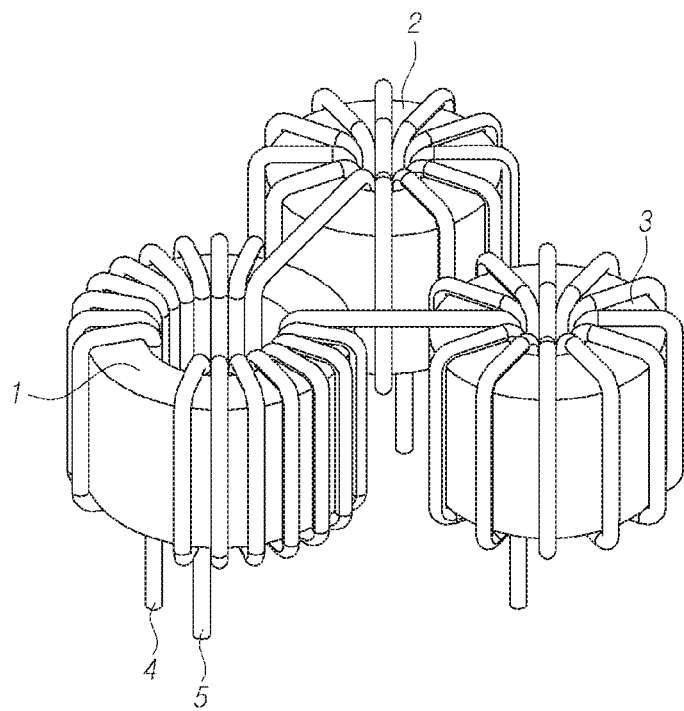
FIGS. 4 and 5 are perspective views illustrating wire configurations of the inductor device according to embodiments.
Figure 5:
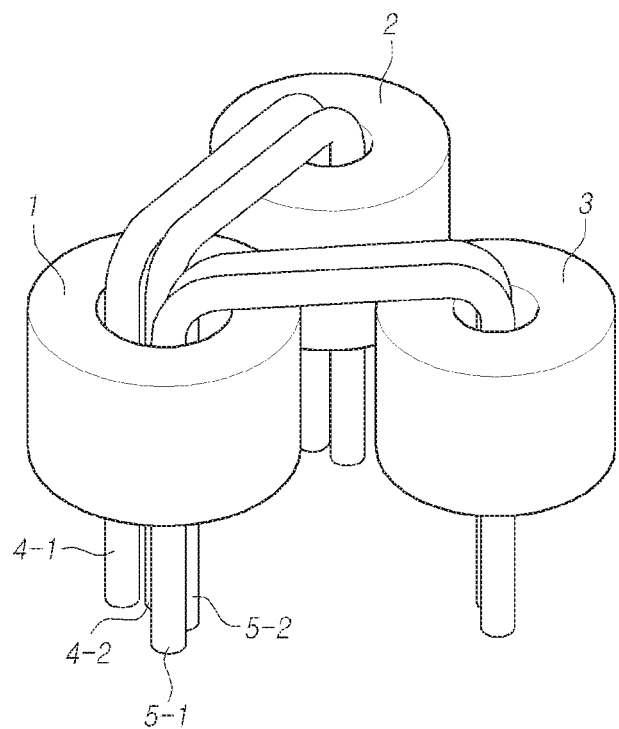

FIGS. 4 and 5 are perspective views illustrating wire configurations of the inductor device according to embodiments.

Referring to FIG. 4, a portion of the first ire 4, passing through the drum-shaped first core 1, may be wound on the drum-shaped first core 1 a plurality of times, i.e. a first number of turns N1, by passing through the hole 1-1 of the drum-shaped first core 1.

A portion of the second wire 5, passing through the drum-shaped first core 1, may be wound on the drum-shaped first core 1 a plurality of times, i.e. a second number of turns N2, by passing through the hole 1-1 of the drum-shaped first core 1.

Another portion of the first wire 4, passing through the drum-shaped second core 2, may be wound on the drum-shaped second core 2 a plurality of times, i.e. a third number of turns N3, by passing through the hole 2-1 of the drum-shaped second core 2.

In addition, another portion of the second wire 5, passing through the drum-shaped third core 3, may be wound on the drum-shaped third core 3 a plurality of times, i.e. a fourth number of turns N4 by passing through the hole 3-1 of the drum-shaped third core 3.

Here, the first to fourth numbers of turns N1, N2, N3, and N4 may be proportional to inductance. Although N1, N2, and N3 may have the same value, this is not intended to be limiting, and N1, N2, and N3 may have different values. In particular, the greater the number of turns, the higher the inductance may be, thereby increasing impedance. This makes it possible to reduce noise by adjusting frequency. Accordingly, in the inductor device according to embodiments, an increase in the number of turns of the wires may improve the ability to remove noise.

Referring to FIG. 5, each of the first wire 4 and the second wire 5 may be a plurality of wires. That is, portions of the plurality of first wires 4-1 and 4-2 and portions of the plurality of second wires 5-1 and 5-2 may be wound on the drum-shaped first core 1 by passing through the hole 1-1 of the drum-shaped first core 1. In addition, other portions of the plurality of first wires 4-1 and 4-2 may be wound on the drum-shaped second core 2 by passing through the hole 2-1 of the drum-shaped second core 2. In addition, other portions of the plurality of second wires 5-1 and 5-2 may be wound on the drum-shaped third core 3 by passing through the hole 3-1 of the drum-shaped third core 3.

In this case, the first wire 4-1 of the plurality of first wires 4-1 and 4-2 and the second wire 5-1 of the plurality of second wires 5-1 and 5-2 may be combined as a pair, while the first wire 4-2 of the plurality of first wires 4-1 and 4-2 and the second wire 5-2 of the plurality of second wires 5-1 and 5-2 may be combined as another pair. In addition, other elements may be connected to the pairs, respectively.

Figure 6:
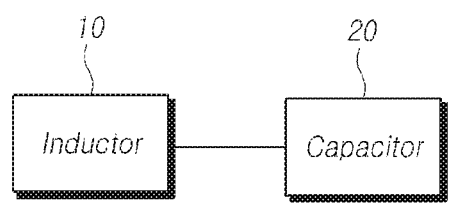
FIG. 6 is a block diagram illustrating the filter device according to embodiments.

FIG. 6 is a block diagram illustrating the filter device according to embodiments.

Referring to FIG. 6, the filter device according to embodiments may include an inductor 10, a capacitor 20, and the like.

The inductor 10 may include the first inductor L1, the second inductor L2, and the third inductor L3, formed from the first to third cores 1, 2, and 3 and the first and second wires 4 and 5. The first inductor L1 may be comprised of the first core 1, a portion of the first wire 4 passing through the first core 1, and a portion of the second wire 5 passing through the first core 1. The second inductor L2 may be comprised of the second core 2 and another portion of the first wire 4 passing through the second core 2. The third inductor L3 may be comprised of the third core 3 and another portion of the second wire 5 passing through the third core 3.

Here, the first to third cores 1, 2, and 3 may have the shape of a drum.

The first to third cores 1, 2, and 3 may have the holes 1-1, 2-1, and 3-1, through which the wires 4 and 5 pass.

The first inductor L1 may be a common mode (CM) inductor, while the second inductor L2 and the third inductor L3 may be differential mode (DM) inductors, respectively.

The first to third cores 1, 2, and 3 may have the shape of a drum. In addition, the portion of the first wire 4 passing through the drum-shaped first core 1 may be wound on the drum-shaped first core 1 a plurality of times, i.e. a first number of turns N1, by passing through the hole 1-1 of the drum-shaped first core 1.

The portion of the second wire 5 passing through the drum-shaped first core 1 may be wound on the drum-shaped first core 1 a plurality of times, i.e. a second number of turns N2, by passing through the hole 1-1 of the drum-shaped first core 1.

The other portion of the first wire 4 passing through the drum-shaped second core 2 may be wound on the drum-shaped second core 2 a plurality of times, i.e. a third number of turns N3, by passing through the hole 2-1 of the drum-shaped second core 2.

In addition, the other portion of the second wire 5 passing through the drum-shaped third core 3 may be wound on the drum-shaped third core 3 a plurality of times, i.e. a fourth number of turns N4, by passing through the hole 3-1 of the drum-shaped third core 3.

Here, the first inductor L1 may further include the separator 6, which may be located between the portion of the first wire 4 passing through the first core 1 and the portion of the second wire 5 passing through the first core 1.

The inductor 10 may be understood to be the same component as the inductor device described above with reference to FIGS. 1 to 5. Hereinafter, descriptions of some features will be omitted when they are identical to those of the above-described inductor device, for the sake of brevity.

The capacitor 20 may be connected to the first wire 4 and the second wire 5 of the inductor 10 in parallel.

For example, the capacitor 20 may be connected, in parallel, to at least one pair of wires selected from among a pair of the first wire 4 and the second wire 5 at one end of the first inductor L1, a pair of the first wire 4 between the other end of the first inductor L1 and one end of the second inductor L2 and the second wire 5 between the other end of the first inductor L1 and one end of the third inductor L3, a pair of the first wire 4 and the second wire 5 at the other ends of the second and third inductor L2 and L3, or combinations thereof.

In addition, the capacitor 20 may include first to third capacitors C1, C2, and C3. The first capacitor C1 may be connected to the second capacitor C2 and the third capacitor C3 in parallel, and the second capacitor C2 and the third capacitor C3 may be connected in series.

Figure 7:
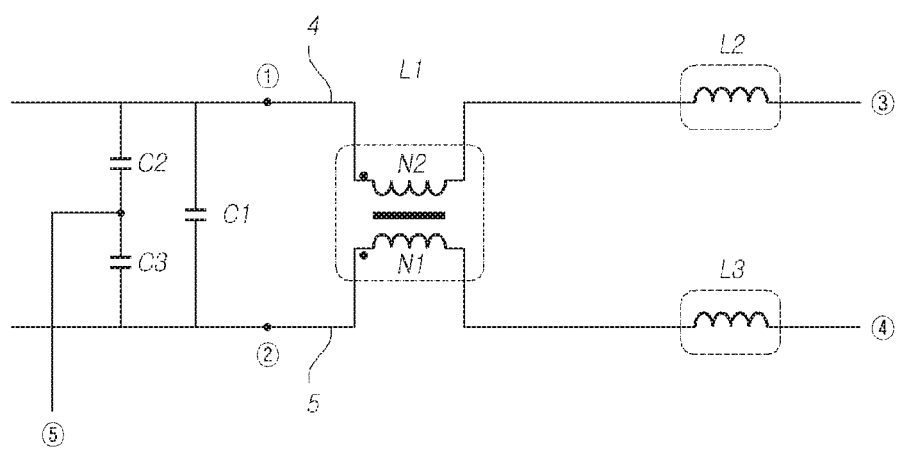
FIGS. 7 to 9 are circuit diagrams illustrating the filter device according to embodiments.
Figure 8:
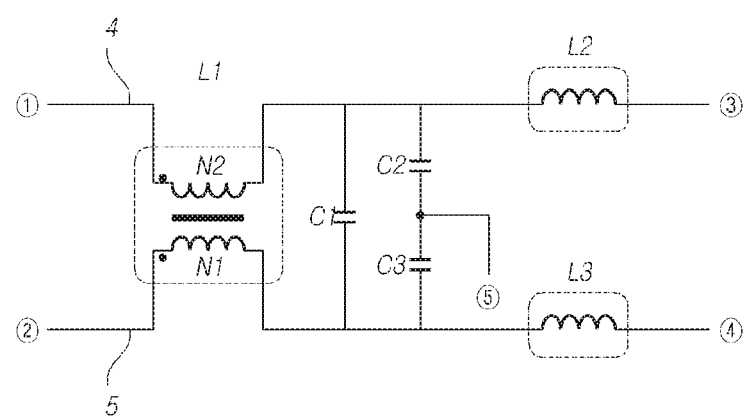
Figure 9:
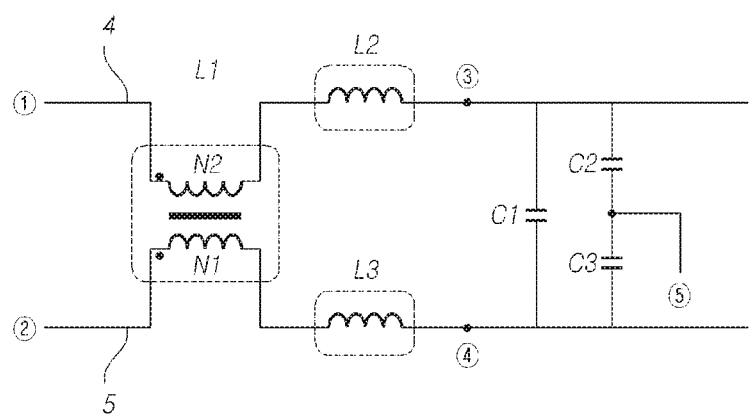

FIGS. 7 to 9 are circuit diagrams illustrating the filter device according to embodiments.

Referring to FIG. 7, the capacitor 20 may be connected to the first wire 4 and the second wire 5 in parallel, at one end of the first inductor L1. That is, the capacitor 20 may be connected between point ① of the first wire 4 and point ② of the second wire 5 in parallel. In particular, between point ① of the first wire 4 and point ② of the second wire 5, the first capacitor C1 may be connected, in parallel, to the second capacitor C2 and the third capacitor C3, connected in series. Here, ground ⑤ may be provided between the second capacitor C2 and the third capacitor C3, connected in series.

Referring to FIG. 8, the capacitor 20 may be connected, in parallel, to the first wire 4 between the other end of the first inductor L1 and one end of the second inductor L2 and to the second wire 5 between the other end of the first inductor L1 and one end of the third inductor L3. That is, the capacitor 20 may be connected to the first wire 4 and the second wire 5 in parallel, between point a of the first wire 4 and point b of the second wire 5. In particular, between point a and point b, the first capacitor C1 may be connected, in parallel, to the second capacitor C2 and the third capacitor C3, connected in series. Here, ground ⑤ may be provided between the second capacitor C2 and the third capacitor C3, connected in series.

Referring to FIG. 9, the capacitor 20 may be connected to the first wire 4 and the second wire 5 in parallel, at the other ends of the second and third inductors L2 and L3. That is, the capacitor 20 may be connected between point ③ of the first wire 4 and point ④ of the second wire 5 in parallel. In particular, between point ③ of the first wire 4 and point ④ of the second wire 5, the first capacitor C1 may be connected, in parallel, to the second capacitor C2 and the third capacitor C3, connected in series. Here, the ground may be provided between the second capacitor C2 and the third capacitor C3, connected in series.

As described above, the filter device according to embodiments may provide an integrated IC filter by exposing wires between the single CM mode inductor and the two DM mode inductors and adding the capacitors thereto. Accordingly, CM noise and DM noise may be effectively removed, no decrease in CM inductance may be caused by unbalanced DM, and the wires having minimum lengths may be used, thereby enabling low DC resistance (Rdc).

Figure 10:
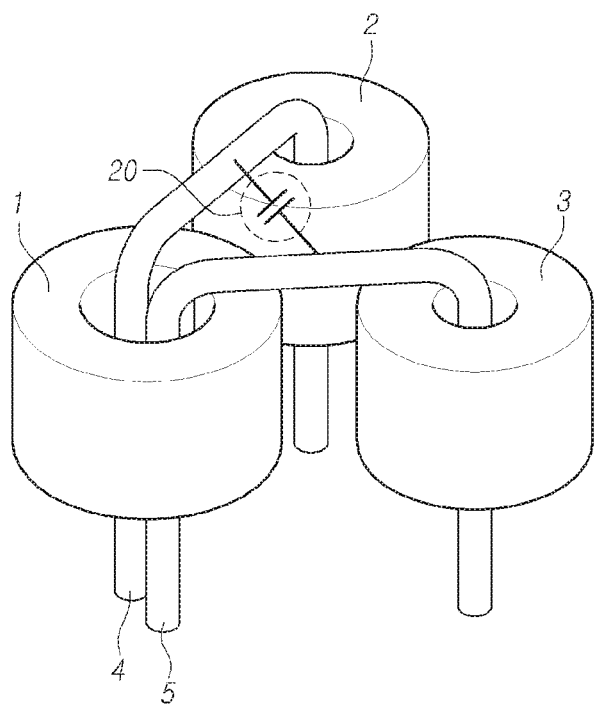
FIG. 10 is a perspective view illustrating the capacitor connected to the inductor according to embodiments.

FIG. 10 is a perspective view illustrating the capacitor connected to the inductor according to embodiments.

Referring to FIG. 10, the capacitor 20 may be connected between the first wire 4 and the second wire 5. That is, as illustrated in FIG. 10, the capacitor 20 may be connected between point a of the first wire 4 and point b of the second wire 5. In this case, an integrated LC filter may be provided in the form of a single package.

Figure 11:
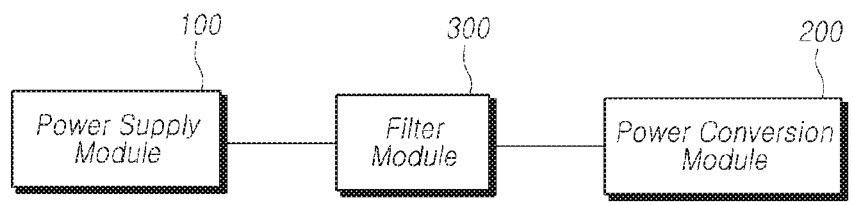
FIG. 11 is a block diagram illustrating the power device according to embodiments.

FIG. 11 is a block diagram illustrating the power device according to embodiments.

Referring to FIG. 11, the power device according to embodiments may include a power supply module 100, a power conversion module 200, a filter module 300, and the like.

The power supply module 100 may supply power.

The power conversion module 200 may convert power supplied thereto.

The filter module 300 is located between the power supply module 100 and the power conversion module 200, and may remove noise. That is, the filter module 300 may remove noise flowing between the power supply module 100 and the power conversion module 200.

The filter module 300 may include the inductor 10 and the capacitor 20. The inductor 10 may include the first inductor L1, the second inductor L2, and the third inductor L3, formed from the first to third cores 1, 2, and 3 and the first and second wires 4 and 5. The first inductor L1 may be comprised of the first core 1, a portion of the first wire 4 passing through the first core 1, and a portion of the second wire 5 passing through the first core 1. The second inductor L2 may be comprised of the second core 2 and another portion of the first wire 4 passing through the second core 2. The third inductor L3 may be comprised of the third core 3 and another portion of the second wire 5 passing through the third core 3. In addition, the capacitor 20 may include at least one capacitor, and may be connected to the first wire 4 and the second wire 5 in parallel.

Here, the first to third cores 1, 2, and 3 may have the shape of a drum.

The first to third cores 1, 2, and 3 may have the holes 1-1, 2-1, and 3-1, through which the wires 4 and 5 pass.

The first inductor L1 may be a CM inductor, while the second inductor L2 and the third inductor L3 may be DM inductors, respectively.

The first to third cores 1, 2, and 3 may have the shape of a drum. In addition, the portion of the first wire 4 passing through the drum-shaped first core 1 may be wound on the drum-shaped first core 1 a plurality of times, i.e. a first number of turns N1, by passing through the hole 1-1 of the drum-shaped first core 1.

The portion of the second wire 5 passing through the drum-shaped first core 1 may be wound on the drum-shaped first core 1 a plurality of times, i.e. a second number of turns N2, by passing through the hole 1-1 of the drum-shaped first core 1.

The other portion of the first wire 4 passing through the drum-shaped second core 2 may be wound on the drum-shaped second core 2 a plurality of times, i.e. a third number of turns N3, by passing through the hole 2-1 of the drum-shaped second core 2.

In addition, the other portion of the second wire 5 passing through the drum-shaped third core 3 may be wound on the drum-shaped third core 3 a plurality of times, i.e. a fourth number of turns N4, by passing through the hole 3-1 of the drum-shaped third core 3.

Here, the first inductor L1 may further include the separator 6, which may be located between the portion of the first wire 4 passing through the first core 1 and the portion of the second wire 5 passing through the first core 1.

The capacitor 20 may be connected, in parallel, to at least one pair of wires selected from among a pair of the first wire 4 and the second wire 5 connected between the power supply module 100 and one end of the first inductor L1, a pair of the first wire 4 between the other end of the first inductor L1 and one end of the second inductor L2 and the second wire 5 between the other end of the first inductor L1 and one end of the third inductor L3, a pair of the first wire 4 connected between the other end of the second inductor L2 and the power conversion module 200 and the second wire 5 connected between the other end of the third inductor L3 and the power conversion module 200, or combinations thereof.

Here, the capacitor 20 may include the first to third capacitors C1, C2, and C3. The first capacitor C1 may be connected to the second capacitor C2 and the third capacitor C3 in parallel, and the second capacitor C2 and the third capacitor C3 may be connected in series. Referring to FIGS. 7 and 11, the capacitor 20 may be connected, in parallel, to the first wire 4 and the second wire 5 connected between the power supply module 100 and one end of the first inductor L1. Referring to FIGS. 8 and 11, the capacitor 20 may be connected, in parallel, to the first wire 4 between the other end of the first inductor L1 and one end of the second inductor L2 and the second wire 5 between the other end of the first inductor L1 and one end of the third inductor L3. Referring to FIGS. 9 and 11, the capacitor 20 may be connected, in parallel, to the first wire 4 connected between the other end of the second inductor L2 and the power conversion module 200 and the second wire 5 connected between the other end of the third inductor L3 and the power conversion module 200.

The filter module 300 may be understood to be the same component as the filter device described above with reference to FIGS. 6 to 10. Hereinafter, descriptions of some features will be omitted when they are identical to those of the above-described filter device, for the sake of brevity.

Referring to FIG. 11 again, the power supply module 100 may supply direct current (DC) power. Here, the power may include a voltage and a current.

In particular, the power supply module 100 may include a battery to supply DC power. However, this is not intended to be limiting, and the power supply module 100 may be connected to an external DC power source to supply DC power. In a situation in which an external power source is an alternating current (AC) power source, the power supply module 100 may include an AC-DC converter to convert external AC power into DC power to supply the DC power.

The power conversion module 200 may convert power supplied. The power conversion module 200 may provide the converted power to a load. Here, the load may include a motor (e.g. a steering motor of a vehicle). However, this is not intended to be limiting, and any type of load may be included, as long as the load may be driven using the converted power.

The power conversion module 200 may include an inverter generating AC power by converting DC power supplied from the power supply module 100 and supplying the AC power to the load.

The filter module 300 may be located between the power supply module 100 and the power conversion module 200. For example, the filter module 300 may be located between a DC power source and the inverter. For example, the first inductor L1 of the filter module 300 may be connected to the DC power source, while the second inductor L2 and the third inductor L3 of the filter module 300 may be located between the first inductor L1 and the inverter.

The filter module 300 may remove noise flowing from the power conversion module 200 to the power supply module 100. For example, the filter module 300 may remove noise from a current from the inverter to the DC power source.

Here, the noise may include DC noise and CM noise.

Accordingly, the filter module 300 may remove the DC noise and the CM noise from the current flowing from the inverter to the DC power source.

That is, the filter module 300 may remove the DM noise by the second inductor L2 and the third inductor L3 connected to the inverter. In addition, the filter module 300 may remove the CM noise by the first inductor L1 connected to the DC power source. Accordingly, the first inductor L1 may be a CM inductor, while the second inductor L2 and the third inductor L3 may be DM inductors, respectively.

Specifically describing with reference to FIGS. 8 and 11, the capacitor 20 of the filter module 300 may be connected, in parallel, to the first wire 4 between the other end of the first inductor L1 and one end of the second inductor L2 and the second wire 5 between the other end of the first inductor L1 and one end of the third inductor L3. That is, the capacitor 20 of the filter module 300 may be connected between point a of the first wire 4 and point b of the second wire 5 in parallel. In particular, between point a of the first wire 4 and point b of the second wire 5, the first capacitor C1 may be connected, in parallel, to the second capacitor C2 and the third capacitor C3, connected in series. Here, ground ⑤ may be provided between the second capacitor C2 and the third capacitor C3, connected in series.

With respect to the filter module 300 as described above, the inverter may be a source of the filter module 300, while the DC power source may be a load. Accordingly, the CM noise and the DM noise may be removed from the current, flowing from the inverter to the DC power source, by the first to third inductors L1, L2, and L3 and the first to third capacitors C1, C2, and C3.

That is, the filter module 300 may remove the DM noise from the current, flowing from the inverter to the DC power source, by the second inductor L2 and the third inductor L3, i.e. the DM inductors, and the first capacitor C1. In addition, the filter module 300 may remove the CM noise from the current, flowing from the inverter to the DC power source, by the second capacitor C2, the third capacitor C3, and the first inductor L1, i.e. the CM inductor.

Figure 12:
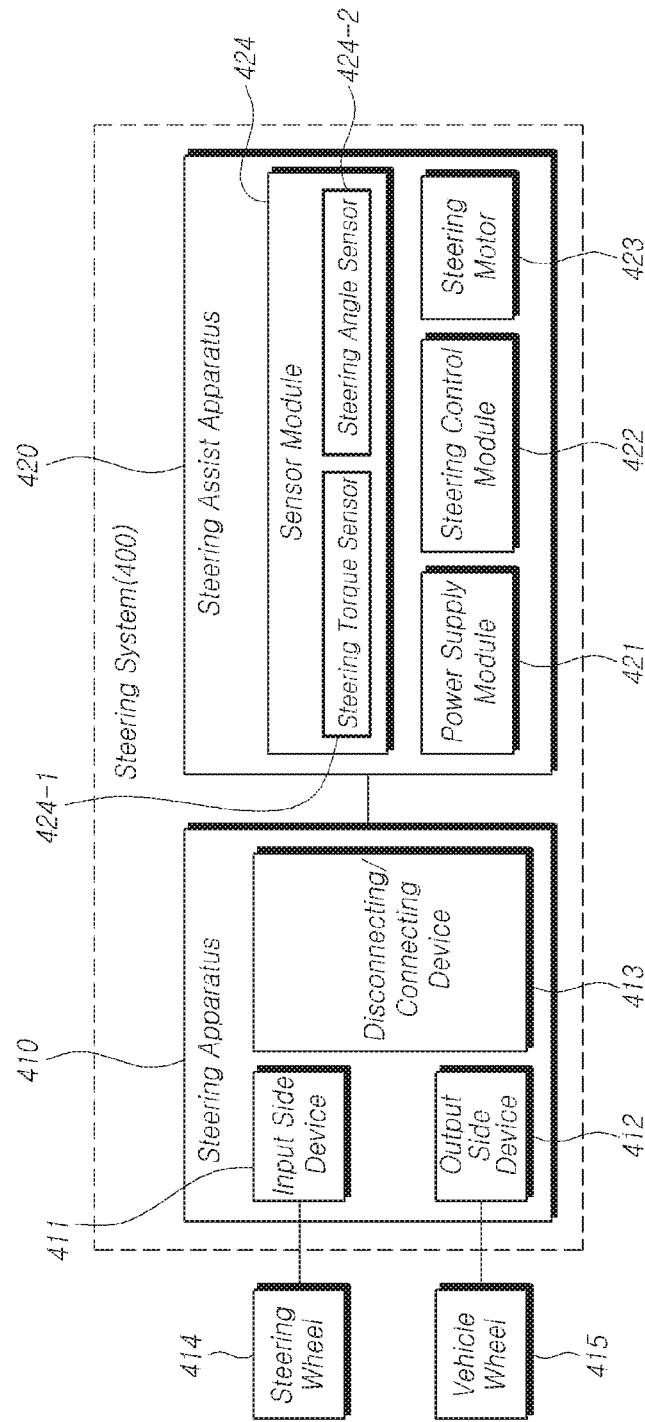
FIG. 12 is a block diagram illustrating the configuration of a steering system according to embodiments.

FIG. 12 is a block diagram illustrating the configuration of a steering system according to embodiments.

Referring to FIG. 12, the steering system 400 according to embodiments may include a steering apparatus 410, a steering assist apparatus 420, and the like.

The steering apparatus 410 may change a steering angle of a vehicle wheel 415, on the basis of steering force (or torque) applied to a steering wheel 414. The steering apparatus 410 may include an input side device 411, an output side device 412, and the like. In addition, the steering apparatus 410 may further include a disconnecting/connecting device 413 and the like.

The input side device 411 may be connected to the steering wheel 414. The input side device 411 may rotate in a direction in which the steering wheel 414 rotates or in a direction opposite to the direction in which the steering wheel 414 rotates. Although the input side device 411 may include a steering column connected to the steering wheel 414 and the like, this is not intended to be limiting. The input side device 411 may include any device (or apparatus), as long as the input side device 411 may rotate (or move) opposite to the direction in which the steering wheel 414 rotates.

The output side device 412 may be connected to the input side device 411 via at least one of an electrical means, a mechanical means, or a combination thereof. The output side device 412 may be connected to the wheel 415 to change the steering angle (or motion or the like) of the wheel 415. The output side device 412 may include at least one selected from among a pinion, a rack, a tie rod, a knuckle arm, or combinations thereof. However, this is not intended to be limiting, and the output side device 412 may include any device (or apparatus) that may change the steering angle (or motion or the like) of the vehicle wheel.

The disconnecting/connecting device 413 may be connected to the input side device 411 and the output side device 412. The disconnecting/connecting device 413 may mechanically or electrically connect or disconnect the input side device 411 and the output side device 412. Although the disconnecting/connecting device 413 may include a clutch, this is not intended to be limiting. The disconnecting/connecting device 413 may include any device (or apparatus) that may mechanically or electrically connect or disconnect the input side device 411 and the output side device 412.

The steering apparatus 410 according to embodiments may include at least one selected from among a steering apparatus in which the input side device and the output side device are mechanically connected, a steering apparatus in which the input side device and the output side device are electrically connected, a steering apparatus in which the input side device and the output side device are connected to the disconnecting/connecting device (or a steer-by-wire (SbW) device including a clutch), or combinations thereof.

Although neither the steering wheel 414 nor the vehicle wheel 415 is illustrated as being included in the steering apparatus 410, this is not intended to be limiting, and the steering wheel 414 or the vehicle wheel 415 may be included in the steering apparatus 410.

The steering assist apparatus 420 may be connected to the steering apparatus 410. The steering assist apparatus 420 may provide assistant steering force to the steering apparatus 410. Although the steering assist apparatus 420 may include an electronic control unit (ECU), this is not intended to be limiting. Rather, the steering assist apparatus 420 may include any control device (or system), as long as the control device (or system) is electronically controllable.

The steering assist apparatus 420 may include a power supply module 421 and a steering control module 422.

The power supply module 421 may supply power. The power supply module 421 may be understood to be the same component as the power supply module 100 described above with reference to FIG. 7. Hereinafter, descriptions of some features will be omitted when they are identical to those of the above-described power supply module 100, for the sake of brevity.

The steering control module 422 may be located between the power supply module 421 and a steering motor 423. The steering control module 422 may generate assistant steering force (e.g. assistant current) by filtering and converting an output of the power supply module 421, in response to a steering motor control signal, and may control the steering motor 423 using the assistant steering force.

The steering assist apparatus 420 according to embodiments may include at least one of a sensor module 424, the steering motor 423, or a combination thereof.

The sensor module 424 may include at least one sensor.

Here, the sensor may include at least one of a steering torque sensor 424-1, a steering angle sensor 424-2, or a combination thereof. However, this is not intended to be limiting, and the sensor may include any sensor that may measure the state of the vehicle and the steering state of the vehicle.

The steering torque sensor 424-1 may measure the steering torque of the steering wheel and provide information regarding the steering torque of the steering wheel to the steering control module 422. In addition, the steering angle sensor 424-2 may measure the steering angle of the steering wheel and provide information regarding the steering angle of the steering wheel to the steering control module 422.

The steering control module 422 may generate the steering motor control signal, on the basis of at least one of the information regarding the steering torque, the information regarding the steering angle, or a combination thereof, generate assistant steering force by filtering and converting the output of the power supply module 421, in response to the steering motor control signal, and control the steering motor 423 using the assistant steering force.

The steering motor 423 may be connected to the steering control module 422. The steering motor 423 may operate using the assistant steering force provided from the steering control module 422 to assist in the steering of the steering apparatus 410.

The steering motor 423 may include at least one of a single winding motor, a dual winding motor, or a combination thereof. However, this is not intended to be limiting, and steering motor 423 may include any motor that may assist in the steering of the steering apparatus.

The steering motor 423 may include at least one of a three-phase motor, a five-phase motor, or a combination thereof. However, this is not intended to be limiting, and steering motor 423 may include any motor that may assist in the steering of the steering apparatus.

Figure 13:
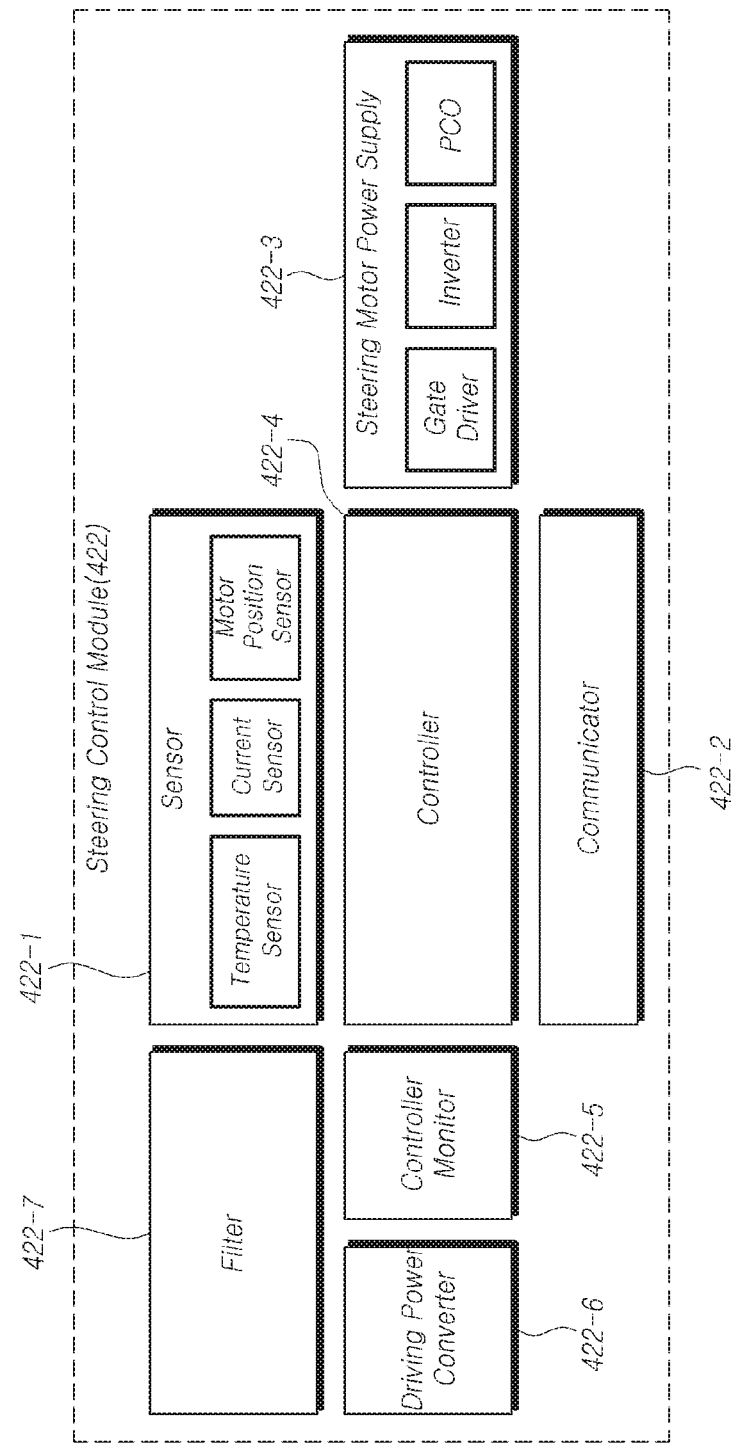
FIG. 13 is a block diagram illustrating the configuration of the steering control module according to embodiments.

FIG. 13 is a block diagram illustrating the configuration of the steering control module according to embodiments.

Referring to FIG. 13, the steering control module 422 according to embodiments may include at least one selected from among a sensor 422-1, a communicator 422-2, a steering motor power supply 422-3, a controller 422-4, a controller monitor 422-5, an operating power converter 422-6, a filter 422-7, or combinations thereof.

The sensor 422-1 may include at least one selected from among a temperature sensor, a current sensor, a motor position sensor, or combinations thereof. However, this is not intended to be limiting, and the sensor 422-1 may include any sensor, as long as the state of the steering system may be measured thereby.

The temperature sensor may measure the temperature of the steering control module and provide information regarding the temperature to the controller 422-4. In addition, the current sensor may measure an assistant current (or assistant steering force), provided from the steering motor power supply 422-3 to the steering motor 324, and provide information regarding the assistant current to the controller 422-4. In addition, the motor position sensor may measure the position of the steering motor 324 and provide information regarding the position of the steering motor to the controller 422-4.

The communicator 422-2 may include at least one of an inner communicator, an outer communicator, or a combination thereof. In a situation in which a plurality of steering control modules 422 are provided, the inner communicator may be connected to another steering control module to provide information to or receive information from the other steering control module. The outer communicator may be connected to the vehicle to receive information regarding a state of the vehicle (e.g. information regarding a speed of the vehicle) or provide information related to the steering system to the vehicle.

The steering motor power supply 422-3 may be understood to be the same component as the power conversion module 200 described above with reference to FIG. 11. Hereinafter, descriptions of some features will be omitted when they are identical to those of the above-described power conversion module 200, for the sake of brevity.

The steering motor power supply 422-3 may generate the assistant steering force by converting the output of the power supply module 421, filtered by the filter 422-7, in response to the steering motor control signal, and control the steering motor 324 using the assistant steering force.

For example, the steering motor power supply 422-3 may include a gate driver, an inverter a phase disconnector (PCO), and the like.

The gate driver may receive the steering motor control signal from the controller 422-4, generate a gate signal on the basis of the received steering motor control signal, and provide the gate signal to the inverter. The inverter may generate the assistant steering force by converting the output of the power supply module 421, filtered by the filter 422-7, in response to the gate signal. The phase disconnector (e.g. a breaker or a disconnector) may be located between the inverter and the steering motor 324 to supply the assistant steering force, provided from the inverter, to the steering motor 324 or block the supply of the assistant steering force.

The controller 422-4 may be connected to respective components of the steering system to control the operation of the components by providing information to the components or receiving information from the components.

For example, the controller 422-4 may provide the steering motor control signal to the gate driver by generating the steering motor control signal, or may provide a disconnection/connection control signal (e.g. a clutch control signal) to the disconnecting/connecting device by generating the disconnection/connection control signal, on the basis of information regarding at least one selected from among the torque of the steering wheel, the steering angle of the steering wheel, the temperature, the assist current, the position of the steering motor, the state of the vehicle (e.g. the speed of the vehicle), the state of input power, the state of the filter, the state of the steering motor, or combinations thereof. However, this is not intended to be limiting, and any device (or computer) that can process (or operate or calculate) a program may be used.

The controller monitor 422-5 may be connected to the controller 422-4. The controller monitor 422-5 may monitor the operating state of the controller 422-4. For example, the controller 422-4 may provide a watchdog signal to the controller monitor 422-5. In addition, the controller monitor 422-5 may be cleared on the basis of the watchdog signal provided from the controller 422-4, or may generate and provide a reset signal to the controller 422-4.

Although the controller monitor 422-5 may include a watchdog, this is not intended to be limiting. The controller monitor may be any device able to monitor the controller. In particular, the watchdog may be a window watchdog having a deadline, i.e. a start point and an end point.

The operating power converter 422-6 may be connected to the filter 422-7. The operating power converter 422-6 may generate an operating voltage for each of the components of the steering assist apparatus by converting the output of the power supply module 421, filtered by the filter 422-7. Although the operating power converter 422-6 may include at least one of a DC-DC converter, a regulator, or a combination thereof, this is not intended to be limiting. Any device may be included, as long as such a device can generate an operating voltage for each of the components of the steering assist apparatus by converting an output of the power supply module.

The filter 422-7 may be understood to be the same component as the filter module 300 described above with reference to FIG. 11. Hereinafter, descriptions of some features will be omitted when they are identical to those of the above-described filter module 300, for the sake of brevity.

The filter 422-7 may filter the output of the power supply module 421.

Here, the filter 422-7 may include the inductor 10 and the capacitor 20. The inductor 10 may include the first inductor L1, the second inductor L2, and the third inductor L3, formed from the first to third cores 1, 2, and 3 and the first and second wires 4 and 5. The first inductor L1 may be comprised of the first core 1, a portion of the first wire 4 passing through the first core 1, and a portion of the second wire 5 passing through the first core 1. The second inductor L2 may be comprised of the second core 2 and another portion of the first wire 4 passing through the second core 2. The third inductor L3 may be comprised of the third core 3 and another portion of the second wire 5 passing through the third core 3. In addition, the capacitor 20 may include at least one capacitor, and may be connected to the first wire 4 and the second wire 5 in parallel.

Here, the first to third cores 1, 2, and 3 may have the shape of a drum.

The first to third cores 1, 2, and 3 may have the holes 1-1, 2-1, and 3-1, through which the wires 4 and 5 pass.

The first inductor L1 may be a CM inductor, while the second inductor L2 and the third inductor L3 may be DM inductors, respectively.

The first to third cores 1, 2, and 3 may have the shape of a drum. In addition, the portion of the first wire 4 passing through the drum-shaped first core 1 may be wound on the drum-shaped first core 1 a plurality of times, i.e. a first number of turns N1, by passing through the hole 1-1 of the drum-shaped first core 1.

The portion of the second wire 5 passing through the drum-shaped first core 1 may be wound on the drum-shaped first core 1 a plurality of times, i.e. a second number of turns N2, by passing through the hole 1-1 of the drum-shaped first core 1.

The other portion of the first wire 4 passing through the drum-shaped second core 2 may be wound on the drum-shaped second core 2 a plurality of times, i.e. a third number of turns N3, by passing through the hole 2-1 of the drum-shaped second core 2.

In addition, the other portion of the second wire 5 passing through the drum-shaped third core 3 may be wound on the drum-shaped third core 3 a plurality of times, i.e. a fourth number of turns N4, by passing through the hole 3-1 of the drum-shaped third core 3.

Here, the first inductor L1 may further include the separator 6, which may be located between the portion of the first wire 4 passing through the first core 1 and the portion of the second wire 5 passing through the first core 1.

one pair of wires selected from among a pair of the first wire 4 and the second wire 5 connected between the power supply module 100 and one end of the first inductor L1, a pair of the first wire 4 between the other end of the first inductor L1 and one end of the second inductor L2 and the second wire 5 between the other end of the first inductor L1 and one end of the third inductor L3, a pair of the first wire 4 connected between the other end of the second inductor L2 and the power conversion module 200 and the second wire 5 connected between the other end of the third inductor L3 and the power conversion module 200, or combinations thereof.

Here, the capacitor 20 may include the first to third capacitors C1, C2, and C3. The first capacitor C1 may be connected to the second capacitor C2 and the third capacitor C3 in parallel, and the second capacitor C2 and the third capacitor C3 may be connected in series.

In addition, the power supply module 100 may include a DC power source, a steering motor power supply 323-3 may include an inverter converting DC power to AC power, the first inductor L1 of the 422-7 may be connected to a DC power source, and the second and third inductors L2 and L3 of the filter 422-7 may be located between the first inductor L1 and the inverter.

Here, the filter 422-7 may remove noise flowing from the inverter to the DC power source.

The noise may include DM noise and CM noise.

Here, the filter 422-7 may remove the DM noise by the second inductor and the third inductor connected to the inverter, and may remove the CM noise by the first inductor connected to the DC power source.

In addition, the steering system according to embodiments may be provided as a steering assist apparatus having a redundant structure.

For example, the steering assist apparatus 420 may include a plurality of steering control modules 422.

According to an embodiment, in a situation in which the plurality of steering control modules include first and second steering control modules and the steering motor is a single winding motor, the first steering control module may filter an output of the power supply module, generate the first assistant steering force by converting the filtered output of the power supply module in response to a first steering motor control signal, and control the single winding motor using the first assistant steering force. The second steering control module may monitor the state of the first steering control module and the state of the filter of the first steering control module. In a situation in which the first steering control module and the filter of the first steering control module are broken, the second steering control module may filter the output of the power supply module, generate second assistant steering force by converting the filtered output of the power supply module in response to a second steering motor control signal, and control a single winding motor using the second assistant steering force.

According to another embodiment, in a situation in which the steering motor is a dual winding motor, the first steering control module may filter the output of the power supply module, generate the first assistant steering force by converting the filtered output of the power supply module in response to the first steering motor control signal, and provide the first assistant steering force to a first coil of the dual winding motor, while the second steering control module may filter the output of the power supply module, generate the second assistant steering force by converting the filtered output of the power supply module in response to the second steering motor control signal, and provide the second assistant steering force to a second coil of the dual winding motor. In this manner, the first and second steering control modules may control the dual winding motor. The first steering control module may monitor the state of the second steering control module and the state of the filter of the second steering control module, while the second steering control module may monitor the state of the first steering control module and the state of the filter of the first steering control module. In a situation in which the first steering control module and the filter of the first steering control module are broken, the second steering control module may filter the output of the power supply module and generate the second assistant steering force by converting the filtered output of the power supply module in response to the second steering motor control signal, or may filter the output of the power supply module and generate the second assistant steering force by increasing the filtered output of the power supply module in response to the second steering motor control signal. In this manner, the second steering module may control the dual winding motor by providing the second assistant steering force or the increased assistant steering force to the second coil of the dual winding motor.

Here, the power supply module 421 may be one or more single power supply modules. That is, in a situation in which a single power supply module 421 is provided, the first and second steering control modules may be connected to the single power supply module. In a situation in which two power supply modules 421 are provided, the first and second steering control modules may be connected to the two power supply modules, respectively.

In addition, the first wire 4 and the second wire 5 of the filter 422-7 may be a plurality of wires.

For example, one first wire 4-1 of the plurality of first wires 4-1 and 4-2 and one second wire 5-1 of the plurality of second wires 5-1 and 5-2 may be combined as a pair, while the other first wire 4-2 of the plurality of first wires 4-1 and 4-2 and the other second wire 5-2 of the plurality of second wires 5-1 and 5-2 may be combined as another pair. Different components may be connected to each of the pairs of wires.

That is, power supply components (e.g. a power supply module, an operating power converter, or a steering motor power supply), such as the power supply module, may be connected to one first wire 4-1 of the plurality of first wires 4-1 and 4-2 and one second wire 5-1 of the plurality of second wires 5-1 and 5-2.

In addition, lines of external signals (e.g. an IGN signal or a CAN signal) incoming from the vehicle may be connected to the other first wire 4-2 of the plurality of first wires 4-1 and 4-2 and the other second wire 5-2 of the plurality of second wires 5-1 and 5-2.

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. A steering system comprising:
   a power supply module;
   a filter filtering an output of the power supply module; and
   a steering control module comprising a steering motor power supply generating assistant steering force by converting the output of the power supply module, filtered in response to a steering motor control signal, and controlling a steering motor using the assistant steering force,
   wherein
   the filter comprises:
      an inductor comprising first to third cores and first and second wires, wherein the first core, a portion of the first wire passing through the first core, and a portion of the second wire passing through the first core are provided as a first inductor, the second core and another portion of the first wire passing through the second core are provided as a second inductor, and the third core and another portion of the second wire passing through the third core are provided as a third inductor; and
      a capacitor comprising at least one capacitor connected to the first wire and the second wire in parallel,
   the power supply module comprises a power supply,
   the steering motor power supply comprises an inverter converting direct current power to alternating current power,
   the first inductor of the filter is connected to a direct current power source, and
   the second and third inductors of the filter are located between the first inductor and the inverter.

2. The steering system according to claim 1, wherein each of the first to third cores is drum-shaped,
   the portion of the first wire passing through the drum-shaped first core is wound on the drum-shaped first core a first number of turns by passing through a hole of the drum-shaped first core,
   the portion of the second wire passing through the drum-shaped first core is wound on the drum-shaped first core a second number of turns by passing through the hole of the drum-shaped first core, the other portion of the first wire passing through the drum-shaped second core is wound on the drum-shaped second core a third number of turns by passing through the hole of the drum-shaped second core, and the other portion of the second wire passing through the drum-shaped third core is wound on the drum-shaped third core a fourth number of turns by passing through the hole of the drum-shaped third core.

3. The steering system according to claim 1, further comprising a separator, wherein the separator is located between the portion of the wire passing through the first core and the portion of the second wire passing through the first core.

4. The steering system according to claim 1, wherein
the first inductor comprises a common mode inductor, and each of the second inductor and the third inductor comprises a differential mode inductor.

5. The steering system according to claim 1, wherein the capacitor is connected, in parallel, to at least one pair of wires selected from among a pair of the first wire and the second wire connected between the power supply module and one end of the first inductor, a pair of the first wire between the other end of the first inductor and one end of the second inductor and the second wire between the other end of the first inductor and one end of the third inductor, a pair of the first wire connected between the other end of the second inductor and the power conversion module and the second wire connected between the other end of the third inductor and the power conversion module, or combinations thereof.

6. The steering system according to claim 1, wherein the capacitor comprises first to third capacitors,
wherein the first capacitor is connected to the second capacitor and the third capacitor in parallel, and the second capacitor and the third capacitor are connected in series.

7. The steering system according to claim 1, wherein the filter removes noise flowing from the inverter to the direct current power source.

8. The steering system according to claim 7, wherein the noise comprises differential mode noise and common mode noise.

9. The steering system according to claim 8, wherein the filter removes the differential mode noise by the second and third inductors connected to the inverter and removes the common mode noise by the first inductor connected to the direct current power source.

* * * * *